United States Patent

Chu et al.

[11] Patent Number: 5,999,011
[45] Date of Patent: Dec. 7, 1999

[54] METHOD OF FAST TESTING OF HOT CARRIER EFFECTS

[75] Inventors: Li-Huan Chu, Hsin-Chu; Wen-Chung Lee, San-Chong, both of Taiwan

[73] Assignee: Taiwan Semiconductor Manufacturing Company, Hsin-Chu, Taiwan

[21] Appl. No.: 09/048,213

[22] Filed: Mar. 26, 1998

[51] Int. Cl.$^6$ .................................................. G01R 31/26
[52] U.S. Cl. ............................................................ 324/769
[58] Field of Search ...................................... 324/769, 765, 324/766, 768; 257/344, 345, 408, 409

[56] References Cited

U.S. PATENT DOCUMENTS

| | | | |
|---|---|---|---|
| 4,868,617 | 9/1989 | Chiao et al. | 257/344 |
| 5,587,665 | 12/1996 | Jiang | 326/16 |
| 5,598,009 | 1/1997 | Bui | 257/48 |
| 5,600,578 | 2/1997 | Fang et al. | 324/765 |
| 5,682,051 | 10/1997 | Harrington, III | 257/369 |

OTHER PUBLICATIONS

C.Y. Chang and S.M. Sze, "ULSI Technology", McGraw Hill, 1996, pp. 657–662. (No Month Available).

*Primary Examiner*—Josie Ballato
*Assistant Examiner*—Minh Tang
*Attorney, Agent, or Firm*—George O. Saile; Stephen B. Ackerman

[57] ABSTRACT

This invention describes a method for improving the test time for hot carrier injection effects in CMOS transistors. In conventional testing of hot carrier effects a stress voltage is applied between the drain and the source of a transistor. This stress voltage is limited by the drain to source punch-through voltage. In the enhance method described within, a substrate back bias is applied that extends the punch-through voltage and allows a higher drain to source stress voltage. With the higher stress voltage the amount of time needed to test parameter degradation caused by hot carrier injection is substantially reduced.

10 Claims, 4 Drawing Sheets

METHOD OF FAST TESTING OF HOT CARRIER EFFECTS

BACKGROUND OF THE INVENTION

1. Field of Invention

This invention relates to testing of semiconductor integrated circuits and in particular testing of parameter degradation caused by hot carrier injection.

2. Description of Related Art

Conventional methods of testing for hot carrier effects on semiconductor transistor parameters are limited by the drain to source punch-through voltage. The effect on transistor parameters is a degradation over time, and the testing is required to assure the parameters meet a certain criteria throughout the specified life of the product. As semiconductor devices are scaled to be smaller for density and performance reasons, punch-through can be more restrictive forcing a lower stress voltage and requiring longer testing time.

In U.S. Pat. No. 5,598,009 (Bui) is described a CMOS transistor design for optimal hot carrier testing. In this scheme is a transistor designed to have multiple common gate areas. There is an adjustment of the pad area to the gate area to minimize deleterious plasma currents. In U.S. Pat. No. 5,587,665 (Jiang) is disclosed a special test circuit for determining performance degradation resulting from hot carrier stress. The test circuit is formed by a string of inverters connected in series. Every other inverter in the series connection is designed to not be sensitive to hot carriers. Thus a signal transition delay is amplified by every other inverter that is sensitive to hot carrier effects on delay. In reference to "ULSI Technology" edited by C. Y Chang and S. M. Sze, McGraw Hill 1996, pp 657–662 is described the reliability effect of hot carrier injection. The fundamental mechanism and equations of the hot carrier effects are described.

In the conventional method of testing reliability of a semiconductor product for hot carrier effects, a drain to source stress voltage is applied for a period of time and parameters are measured for degradation. The time that is required by the test samples under test can be of considerable length. This time can be reduced by increasing the drain to source stress voltage. The magnitude of the stress voltage is limited by the source to drain punch-through of the transistors under test, and limits the reduction in test time for obtaining a reasonable lifetime prediction of the hot carrier effect.

SUMMARY OF THE INVENTION

In this invention the semiconductor substrate is back biased to extend the punch-through voltage, allowing a larger stress voltage and reducing the length of time needed to obtain measurements to predict the lifetime of the hot carrier effect. The method described herein is oriented to an N-channel transistor, but it is applicable to a P-channel device where the polarity of the applied voltages are reversed.

In the test setup for this method an N-channel transistor has its source connected to ground with a positive voltage applied to the drain and gate. The gate voltage is lower in magnitude than the drain. A negative back bias voltage is applied to the P-substrate or a P-well depending upon the design of the integrated circuit device. Applying a more negative (larger magnitude) substrate back bias raises the drain to source punch-through voltage and allows a larger drain to source stress voltage. This in turn permits a shorter test time to be able measure parameter degradation and predict hot carrier lifetime. In an experiment the test time was reduced by as much as 8:1.

Simulation results show that a negative substrate back bias shifts the point of the source to drain punch-through toward the bottom of the substrate. This makes the punch-through path longer, and the drain can withstand a larger stress voltage.

Experimental results show that this enhanced method of using a substrate back bias to extend the punch-through voltage follows the hot electron degradation model of the conventional method. The model is: $TTF \times Id = A \times (Isub/Id)^{-2.9}$ where TTF is time to fail, Id is drain current, Isub is substrate current, and A is a constant being a function of oxide quality and the electric field profile. A plot of the experimental results of the enhanced method show the data points falling on a line running through results from the conventional method of testing and extending to the results of the enhanced method.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
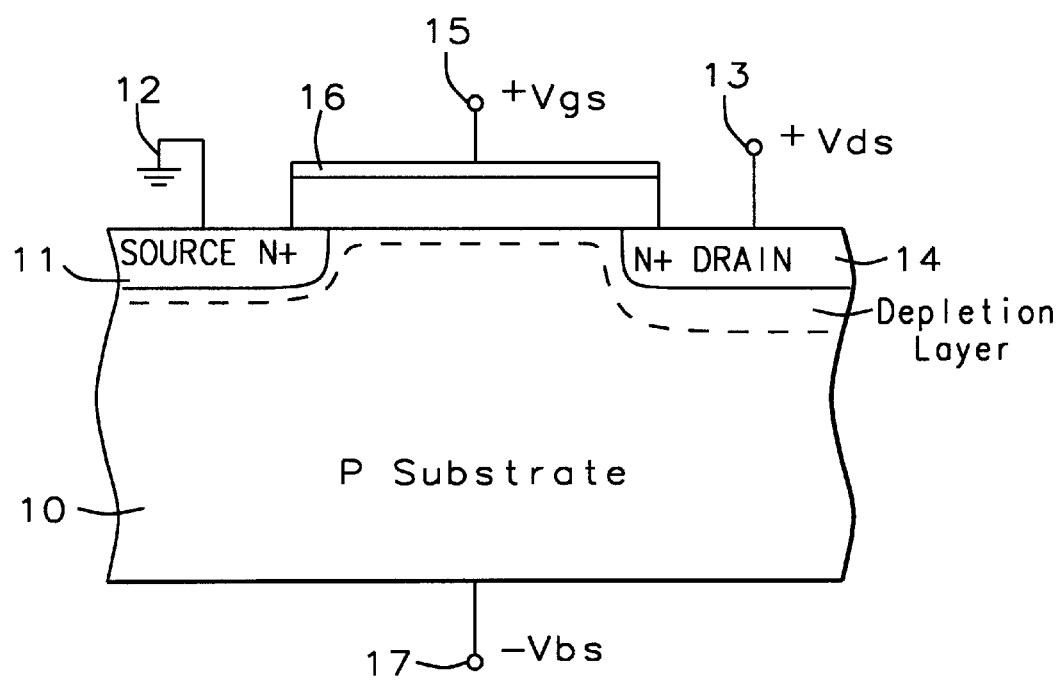
FIG. 1 shows a cross-section view of a semiconductor transistor biased for the enhanced method of hot carrier lifetime testing.

Referring to FIG. 1, a cross-section view of an N-channel transistor on a P-substrate 10 is shown with voltages connected to test for hot carriers. The source 11 of the transistor is connected to ground 12. A positive voltage, Vds, 13 is connected to the drain 14, and a positive voltage, Vgs, 15 connected to the gate 16. The gate voltage, Vgs, 15 is of lower magnitude than the drain voltage, Vds, 13. A substrate back bias, −Vbs, 17 is connected to the substrate 10. The substrate back bias 17 extends the punch-through voltage, allowing the drain voltage 13 to be increased to a higher value to provide additional stress, and permitting a shorter hot carrier test time.

Figure 2:
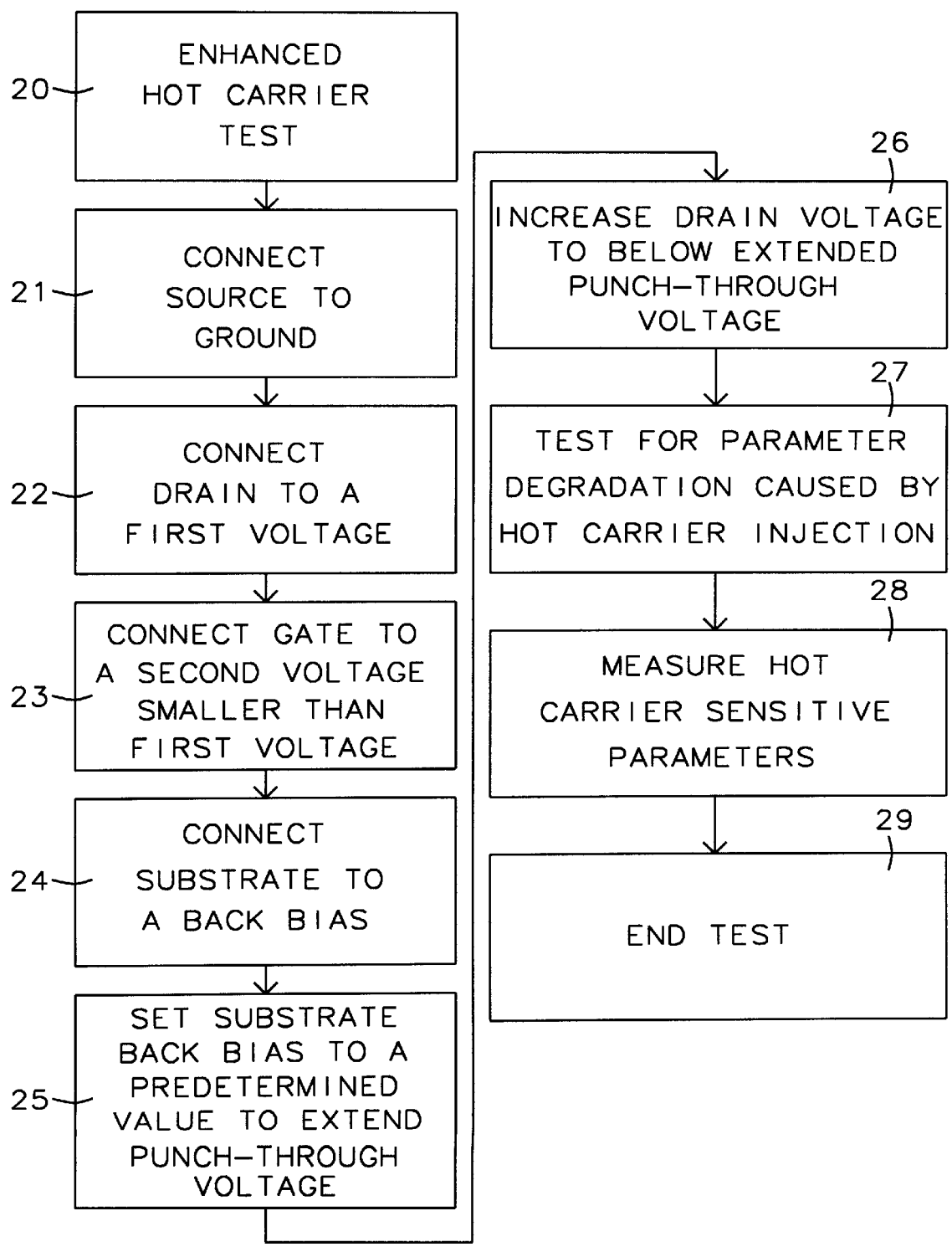
FIG. 2 is a flow diagram of the enhanced method of hot carrier lifetime testing.

In FIG. 2 is shown the method of test for hot carriers using an extended punch-through voltage to allow an increased drain stress voltage and a shorter test time. The source of a transistor to be tested is connected to ground 21, and the drain of the same transistor is connected to a first voltage 22 with the gate connected to a second voltage 23 which is smaller than the first voltage. A back bias is connected to the substrate 24 of the semiconductor, and the back bias is set to a predetermined value to extend the drain to source punch-through voltage 25. The extended punch-through voltage allows a larger drain stress voltage. The drain voltage is increased to a value below the extended punch-through voltage 26. Testing for parameter degradation caused by hot carrier injection is run 27 for a shortened test time as a result of an extended punch-through voltage and increased drain stress voltage. Parameters sensitive to hot carrier effects 28 are measured 28 and the test is ended.

The procedure shown in FIG. 2 can be used for both N-channel and P-channel transistors on a substrate or in the appropriate well. If, for instance, an N-channel transistor in a P-well is to be tested, the back bias of step 24 and 25 would be connected to the P-well. The voltages for a P-channel transistor would be of opposite polarity to those shown in FIG. 1.

Figure 3:
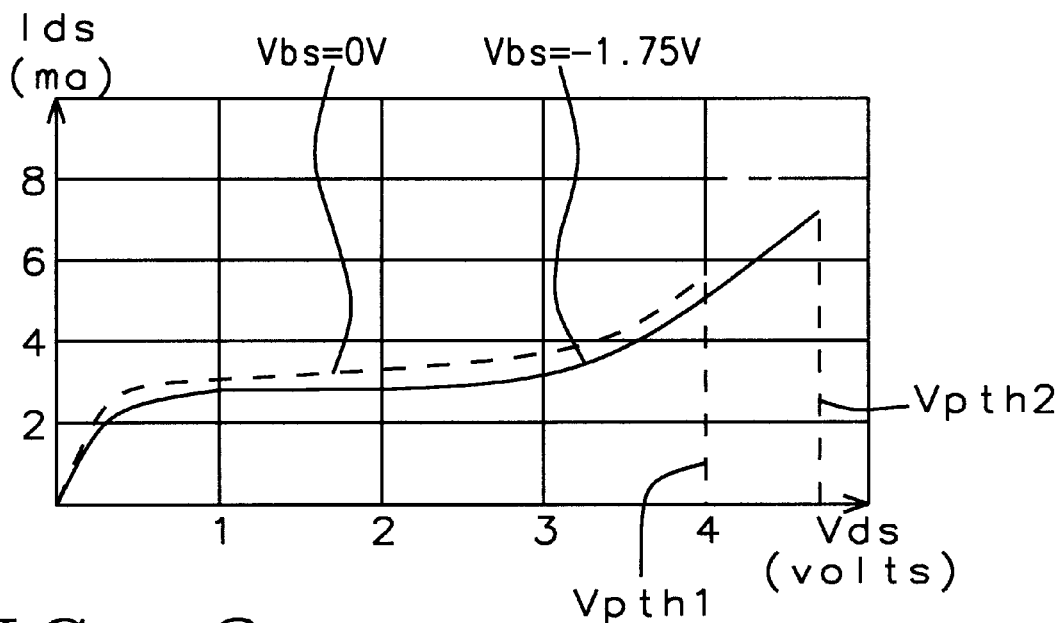
FIG. 3 is a graph that demonstrates the increase in punch-through voltage with applied substrate back bias.

In FIG. 3 is shown a graph of drain current Ids versus drain voltage Vds. Plotted on the graph are two curves, one for substrate back bias Vbs=0 and one for Vbs=−1.75 volts. A substrate back bias Vbs=0 is used in the conventional hot carrier testing methods. At approximately four volts in the example of this graph punch-through Vpth1 occurs and the drain current Ids increases dramatically to approximately eight milli-amperes. When the substrate back bias Vbs=−1.75 volts, the punch-through voltage Vpth2 occurs at an approximate value of the drain voltage Vds=4.8. Other transistors having different characteristics may show similar curves but with different values of Vpth and Ids.

Figure 4:
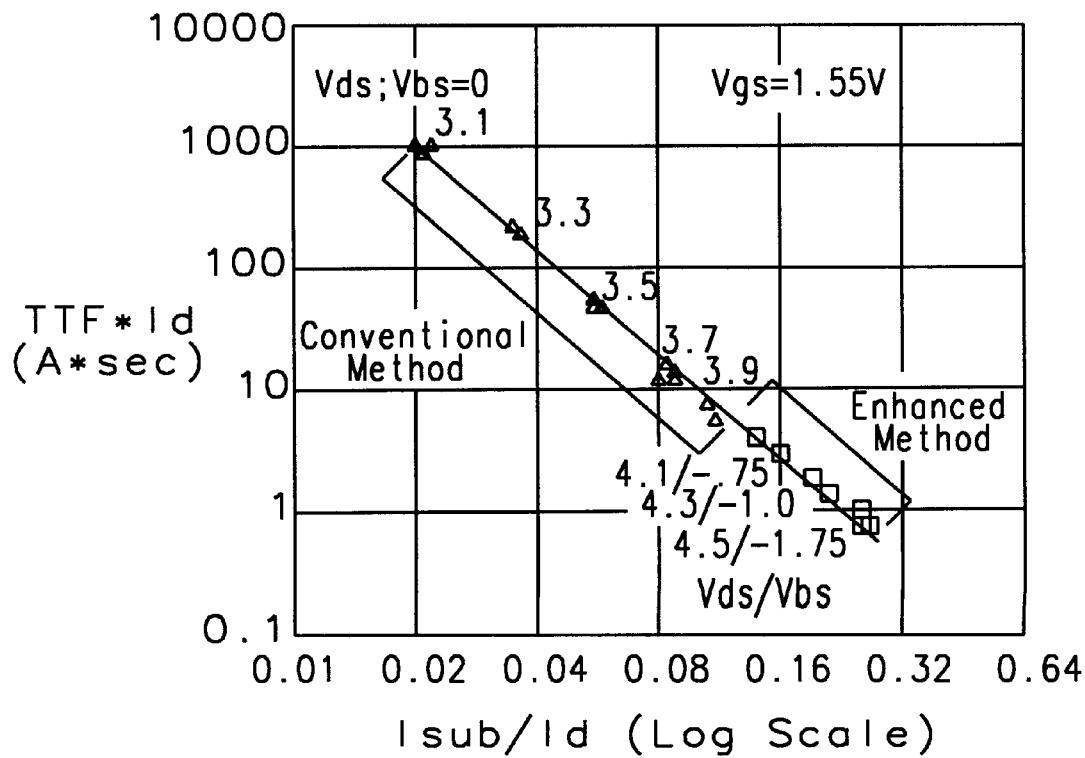
FIG. 4 is a graph of hot carrier lifetime prediction model.

In FIG. 4 is shown a graph of hot carrier lifetime prediction model along with experimental results. The experimental results include both the conventional method of testing for hot carrier effects and the enhanced method of this invention. The graph is a log—log plot of the model: TTF×Id=A×(Isub/Id)$^{-2.9}$ where TTF is time to fail, Id is drain current, Isub is substrate current, and A is a constant being a function of oxide quality and the electric field profile. The gate voltage Vgs=1.55 volts for all the measurements plots on the graph. Those data points plotted for the conventional method were for different drain voltages Vds and with the substrate voltage at Vbs=0. As can be seen the product TTF×Id of the time to fail and the drain current decreases as the drain voltage Vds increases from 3.1 to 3.9 volts. An increase in drain voltage beyond 3.9 volts takes the transistor into punch-through. So further decrease in TTF×Id using the conventional method is not possible for this transistor.

Continuing to refer to FIG. 4, when the test method is enhanced by back biasing the substrate, the punch-through voltage is extended to a higher value, and the drain voltage can be increased further which in turn lowers TTF×Id. Thus the required time to test for hot carrier effects is shortened. The plotted test results for the enhanced method are for different substrate back bias ranging from Vbs=0.75 to 1.75 volts allowing a drain voltage of Vds=4.1 to 4.5 volts. The drain voltage is higher than the voltage at which punch-through occurred using the conventional method. This higher drain voltage Vds creates a higher stress for hot carrier injection effects and reduces the time necessary to test for end of life parameter degradation prediction.

Figure 5:
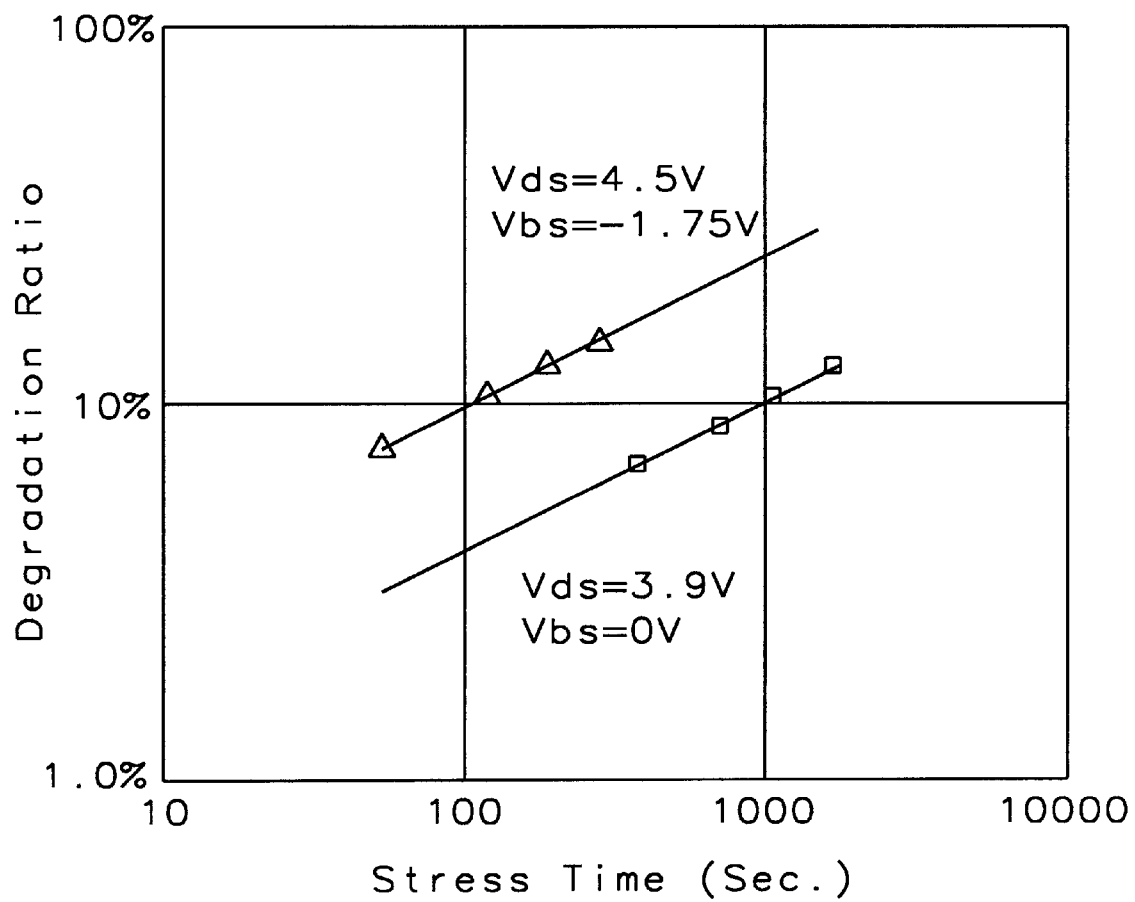
FIG. 5 is a graph that shows reduced test time using a substrate back bias.

In FIG. 5 is shown a plot of the amount of degradation versus stress time for the hot carrier effects. Two curves are plotted, one for the conventional method Vbs=0V and Vds=3.9V, and the enhanced method Vbs=−1.75V and Vds=4.5V. The graph of FIG. 5 is log—log and for the same degradation ratio the two curves are shown separated in stress time by slightly less than an order of magnitude. The actual improvement in stress time is by a factor of 8.5:1. This means that the same results can be obtained from the enhanced method with a substrate back bias for testing for hot carrier effects that is 8.5 times faster than for the conventional method without substrate back bias. Thus the test time using the enhanced method of testing for hot carrier effects can be substantially reduced over conventional methods.

While the invention has been particularly shown and described with reference to preferred embodiments thereof, it will be understood by those skilled in the art that various changes in form and details may be made without departing from the spirit and scope of the invention.

What is claimed is:

1. A method for testing for hot carrier degradation, comprising:
    a) connecting a negative back bias to a P-substrate,
    b) extending transistor punch-through voltage to a higher value by said negative back bias,
    c) increasing stress on said transistor by increasing drain voltage to a level below said punch-through voltage,
    d) reducing test time for hot carrier degradation of said transistor parameters by increasing stress voltage on said transistor.

2. The method of claim 1, wherein magnitude of said P-substrate back bias can be increased to allow a higher punch-through voltage permitting a higher first positive voltage connected to said drain and further reducing said test time.

3. The method of claim 1, wherein said test for hot carrier effect is a timed test in which hot carrier sensitive parameters are measured for degradation.

4. The method of claim 1, wherein the test method can be applied to an N-channel transistor in a P-well with said back bias applied to said P-well.

5. The method of claim 1, wherein the test method can be applied to a P-channel transistor on an N-substrate or in an N-well with the polarity of the voltages reversed.

6. A method for increasing stress to reduce time to test for hot carriers, comprising:
    a) connecting test circuit ground to a source of an N-channel transistor on a P substrate,
    b) connecting to said P-substrate a negative back bias to increase source to drain punch-through voltage of said transistor,
    c) connecting to the drain of said transistor a first positive voltage,
    d) connecting to gate of said transistor a second positive voltage of lower amplitude than the first positive voltage,
    e) adjusting said first positive voltage below punch-through voltage of said transistor to increase voltage stress and reduce test time.

7. The method of claim 6, wherein a higher punch-through voltage resulting from a higher magnitude of the P-substrate back bias increases transistor stress and reduces hot carrier test time.

8. The method of claim 6, wherein said test for hot carriers is a timed test in which hot carrier sensitive parameters are measured for degradation.

9. The method of claim 6, wherein the test method can be applied to an N-channel transistor in a P-well with said back bias applied to said P-well.

10. The method of claim 6, wherein the test method can be applied to a P-channel transistor on an N-substrate or in an N-well with the polarity of the voltages reversed.

* * * * *